United States Patent
Chowdhury et al.

(10) Patent No.: US 9,252,057 B2
(45) Date of Patent: Feb. 2, 2016

(54) LASER AND PLASMA ETCH WAFER DICING WITH PARTIAL PRE-CURING OF UV RELEASE DICING TAPE FOR FILM FRAME WAFER APPLICATION

(71) Applicant: APPLIED MATERIALS, INC., Santa Clara, CA (US)

(72) Inventors: Mohammad Kamruzzaman Chowdhury, Santa Clara, CA (US); Wei-Sheng Lei, San Jose, CA (US); Todd Egan, Fremont, CA (US); Brad Eaton, Menlo Park, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 188 days.

(21) Appl. No.: 14/052,085

(22) Filed: Oct. 11, 2013

(65) Prior Publication Data
US 2014/0106542 A1  Apr. 17, 2014

Related U.S. Application Data

(60) Provisional application No. 61/715,190, filed on Oct. 17, 2012.

(51) Int. Cl.
*H01L 21/82* (2006.01)
*H01L 21/67* (2006.01)
(Continued)

(52) U.S. Cl.
CPC .......... *H01L 21/82* (2013.01); *H01L 21/67207* (2013.01); *H01L 21/6836* (2013.01);
(Continued)

(58) Field of Classification Search
CPC .................. H01L 21/6836; H01L 2221/68327; H01L 2224/83874; H01L 51/5246; H01L 21/67115; H01L 27/14687
See application file for complete search history.

(56) References Cited

U.S. PATENT DOCUMENTS 4,049,944 A    9/1977  Garvin et al.
4,339,528 A    7/1982  Goldman
(Continued)

FOREIGN PATENT DOCUMENTS

JP    08-274048    10/1996
JP    9216085    8/1997
(Continued)

OTHER PUBLICATIONS

International Search Report and Written Opinion from PCT/US2013/064879 mailed Jan. 28, 2014, 9 pages.
(Continued)

*Primary Examiner* — Bac Au
(74) *Attorney, Agent, or Firm* — Blakely Sokoloff Taylor Zafman LLP (57) ABSTRACT

Methods and systems of laser and plasma etch wafer dicing using UV-curable adhesive films. A method includes forming a mask covering ICs formed on the wafer. The semiconductor wafer is coupled to a film frame by a UV-curable adhesive film. A pre-cure of the UV-curable adhesive film cures a peripheral portion of the adhesive extending beyond an edge of the wafer to improve the exposed adhesive material's resistance to plasma etch and reduce hydrocarbon redeposition within the etch chamber. The mask is patterned by laser scribing to provide a patterned mask with gaps. The patterning exposes regions of the semiconductor wafer, below thin film layers from which the ICs are formed. The semiconductor wafer is plasma etched through the gaps in the patterned mask to singulate the ICs. A center portion of the UV-curable adhesive is then cured and the singulated ICs detached from the film.

16 Claims, 10 Drawing Sheets

(51) Int. Cl.
*H01L 21/78* (2006.01)
*H01L 21/683* (2006.01)

(52) U.S. Cl.
CPC ......... *H01L21/78* (2013.01); *H01L 2221/6834* (2013.01); *H01L 2221/68327* (2013.01); *H01L 2221/68336* (2013.01); *H01L 2221/68381* (2013.01)

(56) References Cited

U.S. PATENT DOCUMENTS

| | | | |
|---|---|---|---|
| 4,684,437 | A | 8/1987 | Donelon et al. |
| 5,336,638 | A | 8/1994 | Suzuki et al. |
| 5,593,606 | A | 1/1997 | Owen et al. |
| 5,691,794 | A | 11/1997 | Hoshi et al. |
| 6,051,503 | A | 4/2000 | Bhardwaj et al. |
| 6,057,180 | A | 5/2000 | Sun et al. |
| 6,174,271 | B1 | 1/2001 | Kosmowski |
| 6,300,593 | B1 | 10/2001 | Powell |
| 6,306,731 | B1 | 10/2001 | Igarashi et al. |
| 6,407,363 | B2 | 6/2002 | Dunsky et al. |
| 6,426,275 | B1 | 7/2002 | Arisa |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2009/0255911 | A1 | 10/2009 | Krishnaswami et al. |
| 2010/0013036 | A1 | 1/2010 | Carey |
| 2010/0055877 | A1* | 3/2010 | Kajiyama et al. ............. 438/464 |
| 2010/0216313 | A1 | 8/2010 | Iwai et al. |
| 2010/0248451 | A1 | 9/2010 | Pirogovsky et al. |
| 2011/0014777 | A1 | 1/2011 | Haji et al. |
| 2011/0312157 | A1 | 12/2011 | Lei et al. |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2008171844 | 7/2008 |
| JP | 2009123988 | 6/2009 |
| JP | 2010135356 | 6/2010 |
| JP | 2012-079936 | 4/2012 |
| WO | WO-03036712 | 5/2003 |
| WO | WO-03071591 | 5/2003 |

OTHER PUBLICATIONS

Linder, V. et al., "Water-Soluble Sacrificial Layers for Surface Micromachining", www.small-journal.com, 2005, 1, No. 7, 7 pgs.

Singh, Saravjeet et al., "Apparatus and Methods for Dry Etch With Edge, Side and Back Protection", U.S. Appl. No. 61/491,693, filed May 31, 2011 24 pgs.

International Preliminary Report on Patentability from PCT/US2013/064879 mailed Apr. 21, 2015, 5 pgs.

* cited by examiner

LASER AND PLASMA ETCH WAFER DICING WITH PARTIAL PRE-CURING OF UV RELEASE DICING TAPE FOR FILM FRAME WAFER APPLICATION

CROSS REFERENCE TO RELATED APPLICATION

This application claims the benefit of priority to U.S. Provisional Application No. 61/715,190 filed on Oct. 17, 2012, titled "LASER AND PLASMA ETCH WAFER DICING WITH PARTIAL PRE-CURING OF UV RELEASE DICING TAPE FOR FILM FRAME WAFER APPLICATION," the entire contents of which is hereby incorporated by reference in its entirety for all purposes.

TECHNICAL FIELD

Embodiments of the present invention pertain to the field of semiconductor processing and, in particular, to methods of dicing semiconductor wafers, each wafer having a plurality of integrated circuits thereon.

DESCRIPTION OF RELATED ART

In semiconductor wafer processing, integrated circuits are formed on a wafer (also referred to as a substrate) composed of silicon or other semiconductor material. In general, layers of various materials which are either semiconducting, conducting, or insulating are utilized to form the integrated circuits. These materials are deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximately 15 microns thick. As such, to insure that cracking and other damage surrounding the cut made by the saw does not harm the integrated circuits, three hundred to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments of the invention are directed to methods of dicing semiconductor wafers, each wafer having a plurality of integrated circuits thereon. According to one embodiment, a method of dicing a semiconductor wafer including a plurality of integrated circuits involves forming a mask above the semiconductor wafer. The mask covers and protects the integrated circuits. The method involves coupling the semiconductor wafer to a film frame with an ultra-violet (UV)-curable adhesive film. The method involves pre-curing a peripheral portion of the adhesive film disposed beyond an edge of the semiconductor wafer. The method involves patterning the mask with a laser scribing process to provide a patterned mask with gaps, exposing regions of the semiconductor wafer between the integrated circuits. The method also involves etching the semiconductor wafer through the gaps in the patterned mask to form singulated integrated circuits while the semiconductor wafer is affixed to the adhesive film.

According to one embodiment, a method of dicing a plurality of integrated circuits involves coupling a masked crystalline silicon substrate to a film frame with a UV-curable adhesive film. The method involves pre-curing a peripheral portion of the adhesive film disposed beyond an edge of the silicon substrate. The method involves patterning the mask, at least a layer of silicon dioxide, a layer of low K material, and a layer of copper with a laser scribing process to expose regions of the silicon substrate between the integrated circuits. The method involves etching the silicon substrate through the exposed regions to form singulated integrated circuits. The method involves curing a center portion of the adhesive film disposed within the edge of the silicon substrate by exposure to UV light. The method also involves detaching the singulated integrated circuits from the cured adhesive film.

According to one embodiment, a system for dicing a semiconductor wafer comprising a plurality of integrated circuits (ICs) includes a deposition chamber to form a mask above the semiconductor wafer, the mask covering and protecting the ICs. The system includes an adhesive film applicator to couple the semiconductor wafer to a film frame with an ultraviolet (UV)-curable adhesive film. The system includes a curing station to pre-cure a peripheral portion of the adhesive film disposed beyond an edge of the semiconductor wafer. The system includes a laser scribe module to pattern the mask with a laser scribing process to provide a patterned mask with gaps, exposing regions of the semiconductor wafer between the integrated circuits. The system also includes a plasma etch chamber to etch the semiconductor wafer through the gaps in the patterned mask to form singulated integrated circuits while the semiconductor wafer is affixed to the adhesive film.

BRIEF DESCRIPTION OF THE DRAWINGS

Embodiments of the present invention are illustrated by way of example, and not limitation, in the figures of the accompanying drawings in which.

DETAILED DESCRIPTION

Methods of dicing semiconductor wafers, each wafer having a plurality of integrated circuits thereon, are described. In the following description, numerous specific details are set forth, such as laser and plasma etch wafer dicing approaches with UV-curable adhesive films, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser scribe process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

In a hybrid wafer or substrate dicing process a wafer to be diced is generally mounted on a tape film frame with a UV-curable adhesive film (e.g., UV-release dicing tape). The tape film frame may be of a type amenable to conventional pick-and-place equipment and also amenable to robotic handling and clamping inside a plasma etch chamber during the hybrid dicing process.

In an embodiment, a semiconductor wafer is mounted on a first, center, portion of an adhesive side of a single or double-side UV-curable adhesive film with a second, periphery, portion of the adhesive side extending out beyond an edge of the wafer. Prior to loading the tape frame into a plasma etch chamber during the plasma etching phase, a cure of the periphery portion of the adhesive side of the UV film is performed to cross-link the adhesive in regions beyond the wafer edge that will be exposed to the plasma etch process. It has been found that during plasma etching, the cured adhesive when exposed to the high density plasma is less subject to evaporate and redeposit into the device structures and etched features disposed on the wafer. For example, occurrences of etch stop during the plasma etch may be reduced or eliminating by the pre-curing of the periphery adhesive portion of the UV film.

In an embodiment, pre-curing of the periphery adhesive portion extending beyond the wafer edge is performed through UV irradiation from either a backside or frontside of the UV-curable adhesive film. In advantageous embodiments where the UV irradiation is performed through the backside of the UV-curable adhesive film, a center portion of the adhesive adhering to the wafer is shadowed from the back-side UV light with a shadow mask, for example, a dummy wafer having approximately a same diameter as the semiconductor wafer undergoing dicing.

Following the plasma etching, individual dies may be picked from the UV-curable adhesive film by curing the center portion of the adhesive side to release the UV film. Alternatively, a second dicing tape with a frame may be applied to a front side of the semiconductor wafer and dies removed from the UV-curable adhesive film en masse and individual dies then picked from the taped frame for subsequent packaging and assembly operations.

In an embodiment, a suitable wafer thickness for the above approach is approximately 50 microns or thicker. For IC memory chips, as memory capacity increases, multichip functions and continuous packaging miniaturization may require ultra thin wafer dicing. For logic device chips/processors, major challenges lie in IC performance increase, low k materials and other material adoption. Wafer thicknesses in the range of approximately 100 microns to 760 microns are used for such applications to ensure sufficient chip integrity. Processor chip designers/fabricators may place test element groups (TEGs or test patterns) as well as alignment patterns in wafer streets. A kerf width approximately in the range of 50 microns to 100 microns, at least at the top surface of the wafer, may thus be needed to separate adjacent chips and remove only the test patterns. A major focus is to achieve delamination-free and efficient dicing processes.

Embodiments described herein may address dicing applications of IC wafers, especially with processor chips that have a thickness approximately in the range of 100 microns to 800 microns, and more particularly approximately in the range of 100 microns to 600 microns thickness, and an acceptable dicing kerf width approximately in the range of 50 microns to 200 microns, and more particularly approximately in the range of 50 microns to 100 microns, measured on wafer front surface (e.g., corresponding typical kerf width measured from back side of wafer is approximately 30-50 microns in a laser/saw hybrid process). One or more embodiments are directed to a hybrid laser scribing plus plasma etching approach to dice wafers as described above.

Figure 1A:
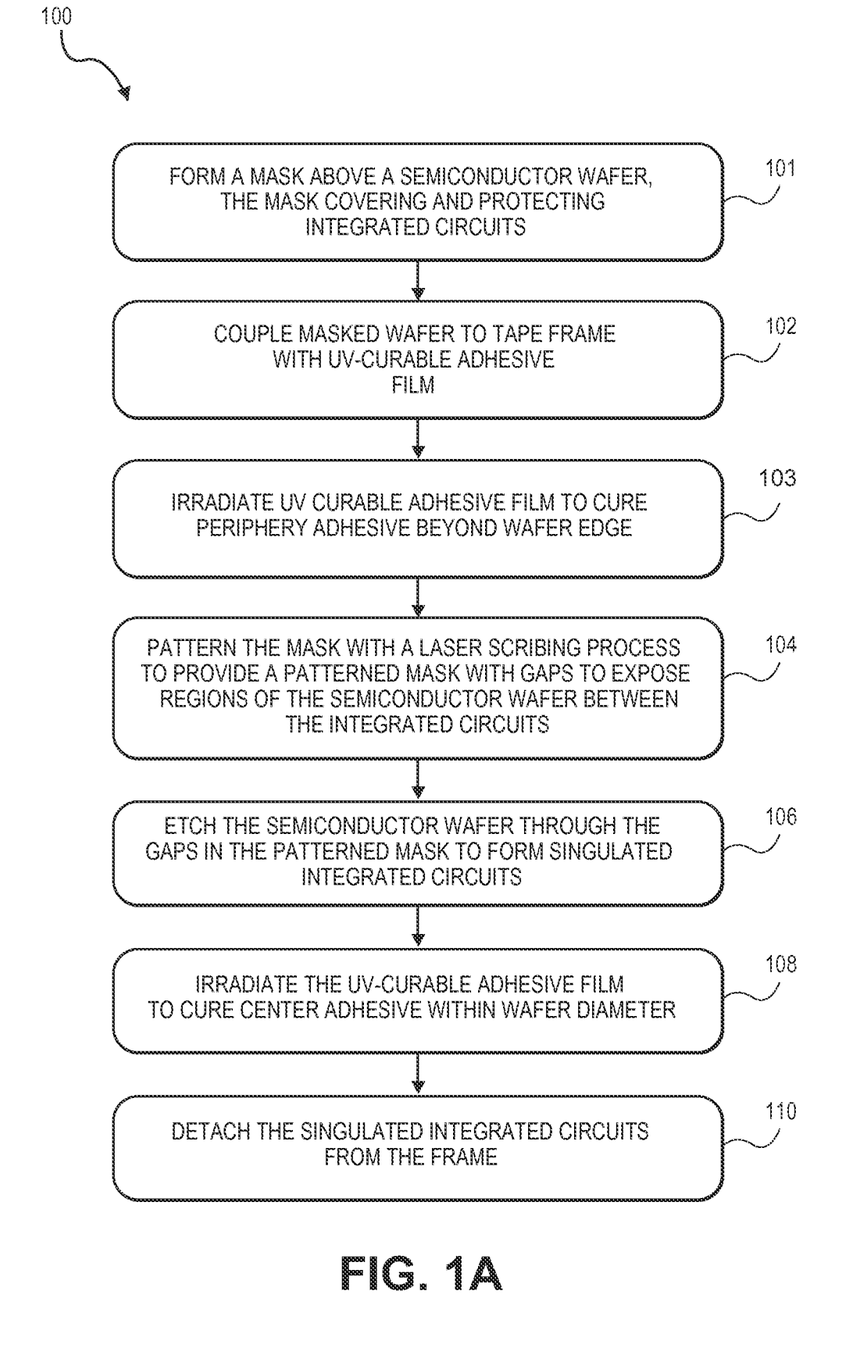
FIG. 1A is a flowchart representing operations in a method of dicing a semiconductor wafer including a plurality of integrated circuits, in accordance with an embodiment of the present invention.
Figure 1B:
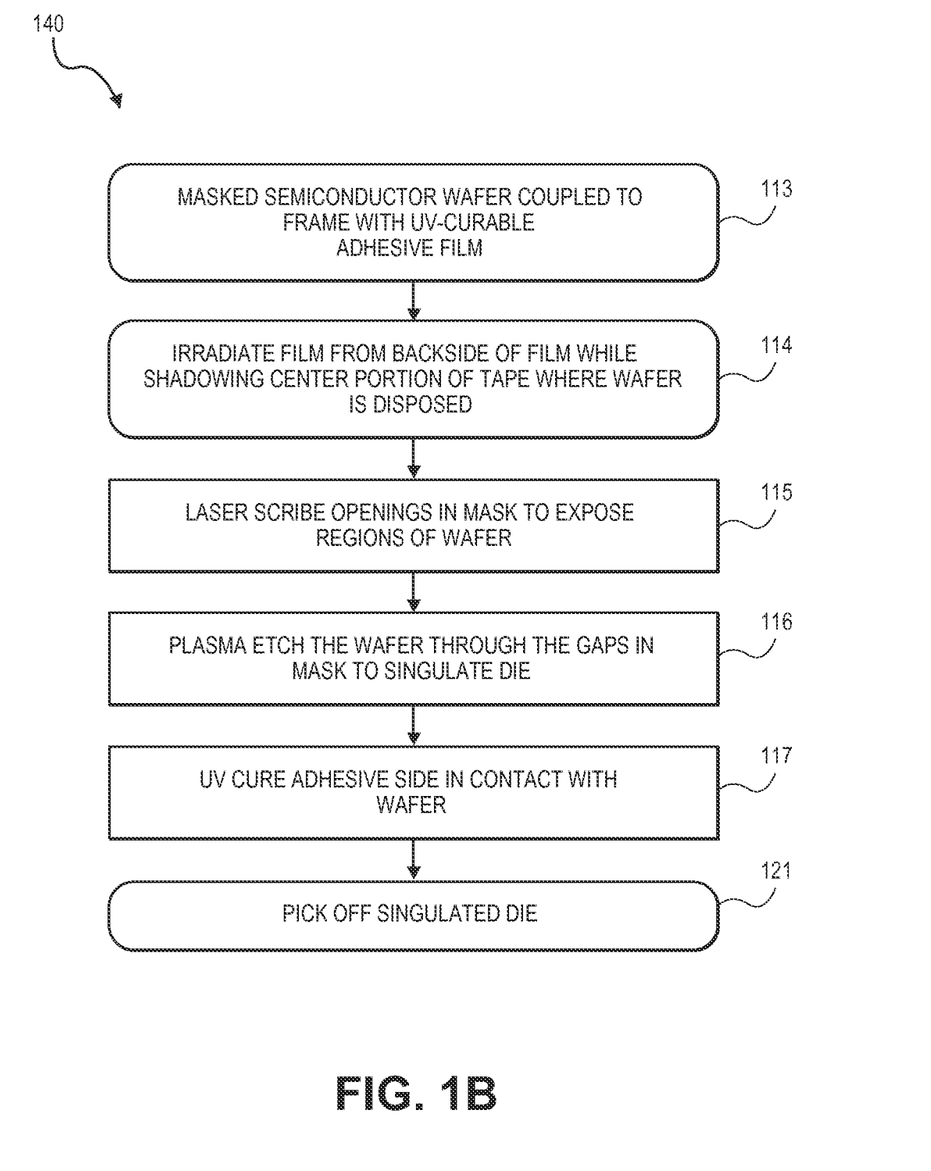
FIG. 1B is a flowchart representing operations in a method of dicing a semiconductor wafer including a plurality of integrated circuits, in accordance with an embodiment of the present invention.
Figure 2A:
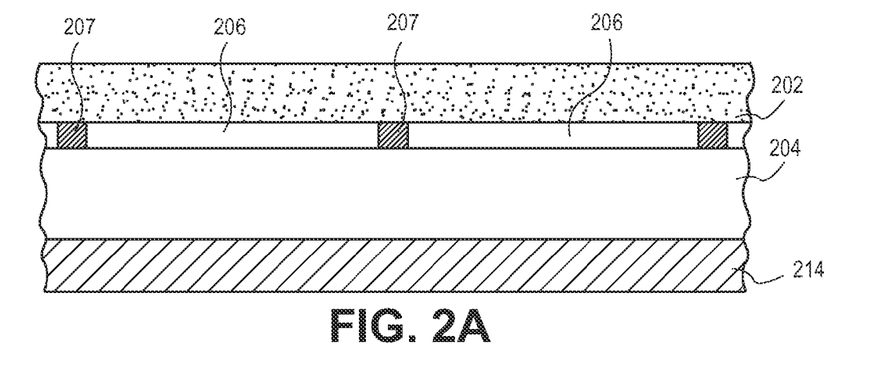
FIG. 2A illustrates a cross-sectional view of a semiconductor wafer including a plurality of integrated circuits during performance of a method of dicing the semiconductor wafer, corresponding to operation 101 of FIG. 1A, in accordance with embodiments of the present invention.
Figure 2B:
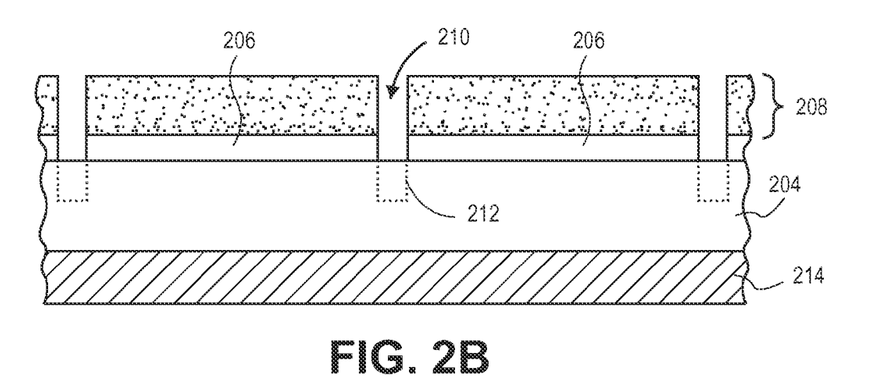
FIG. 2B illustrates a cross-sectional view of a semiconductor wafer including a plurality of integrated circuits during performance of a method of dicing the semiconductor wafer, corresponding to operation 104 of FIG. 1A and operation 115 of FIG. 1B, in accordance with embodiments of the present invention.
Figure 2C:
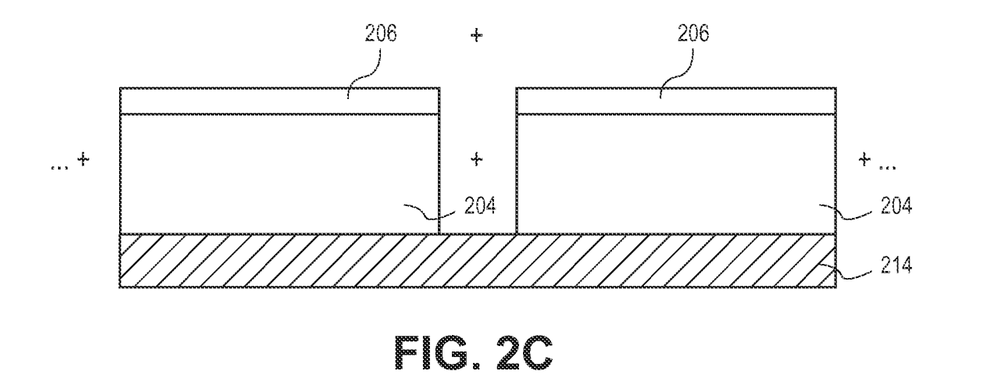
FIG. 2C illustrates a cross-sectional view of a semiconductor wafer including a plurality of integrated circuits during performance of a method of dicing the semiconductor wafer, corresponding to operation 106 of FIG. 1A and operation 116 of FIG. 1B, in accordance with embodiments of the present invention.

FIG. 1A illustrates operations in a method 100 of dicing a semiconductor wafer including a plurality of integrated circuits, in accordance with an embodiment of the present invention. FIG. 1B illustrates operations in a method 140 of dicing a semiconductor wafer including a plurality of integrated circuits, in accordance with an embodiment of the present invention. Method 140 is one exemplary embodiment of the more general method 100. FIGS. 2A-2C illustrate cross-sectional views of a semiconductor wafer including a plurality of integrated circuits during performance of the methods 100 and 140 while FIGS. 4A-4H illustrate cross-sectional views of attachment and detachment of the semiconductor wafer to a carrier substrate during performance of the methods 100 and 140.

Figure 4A:
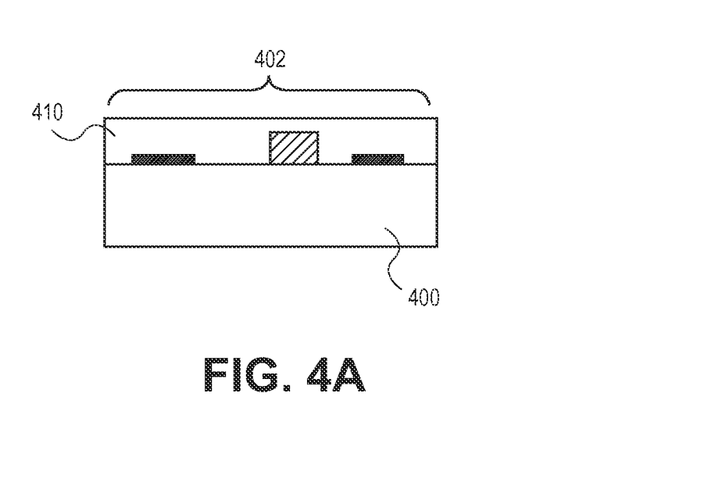
FIGS. 4A, 4B, 4C, 4D, 4E, 4F, 4G, and 4H illustrate cross-sectional views of various operations in a method of dicing a semiconductor wafer, in accordance with embodiments of the present invention.

Referring to operation 101 of the method 100, and corresponding FIG. 2A, a mask 202 is formed above a semiconductor wafer or substrate 204. The wafer or substrate 204 is disposed on a UV-curable adhesive film 214 having an adhesive disposed on at least one side of the carrier film. The UV-curable adhesive film 214 may be further disposed on a film frame (not shown in FIGS. 2A-2C), as described in greater detail in association with FIGS. 4A-4H. As is shown in FIG. 4A, a mask 410, which may be any of the materials described for the mask 202, is disposed on an active side 402 of semiconductor wafer 400, e.g., by spin coating a resist or other material. Although illustrated in FIG. 4A as a non-conformal, planarized mask (e.g., thickness of the mask 410 over a bump is less than thickness of the mask 410 in a valley), in an alternate embodiment, the mask 410 is a conformal mask. Conformal mask embodiments advantageously ensure sufficient thickness of the mask 410 over topography (e.g., 20 μm bumps) to survive the duration of a plasma etch dicing operation. Formation of a conformal mask may be by CVD, for example, or by any other process known in the art.

Depending on the thickness or the material properties of the semiconductor wafer 400, the mask 410 may be applied before or after attaching the wafer 400 to a film frame. In the exemplary embodiment illustrated in FIG. 1A and FIG. 4A, the mask is applied prior to attaching the semiconductor wafer 400 to a film frame. In certain such embodiments, the wafer 400 has a thickness greater than 350 μm. In the exemplary embodiment illustrated in FIG. 1B, the mask is applied subsequent to attaching the semiconductor wafer 400 to a film frame. In certain such embodiments, the wafer 400 has a thickness less than 350 μm.

As shown in FIG. 2A, the mask 202 covers and protects integrated circuits (ICs) 206 formed on the surface of semiconductor wafer 204 and also protects bumps projecting or protruding up (e.g., 10-20 μm) from the surface of the semiconductor wafer 204. The mask 202 also covers intervening streets 207 formed between adjacent ones of the integrated circuits 206.

In accordance with an embodiment of the present invention, forming the masks 202 and 410 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a sensitizer. In another embodiment, the photo-resist layer is composed of a negative photo-resist material.

In an embodiment, semiconductor wafer or substrates 204 (FIGS. 2A-2C) and 400 (FIG. 4A-4G) are of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material or III-N such as, e.g., GaN used in the fabrication of light emitting diodes (LEDs).

Referring to FIG. 2A, the semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Conductive bumps and passivation layers may be formed above the interconnect layers. Materials making up the streets 207 may be similar to or the same as those materials used to form the integrated circuits 206. For example, the streets 207 may be composed of layers of dielectric materials, semiconductor materials, and metallization. In one embodiment, one or more of the streets 207 includes test devices similar to the actual devices of the integrated circuits 206.

Returning to FIG. 1A, the method 100 proceeds with coupling a semiconductor wafer to a film frame with a UV-curable adhesive film at operation 102. In an embodiment, the UV-curable adhesive film 214 in FIGS. 2A-2C and the UV-curable adhesive film 406 in FIGS. 4B-4H is a dicing tape including a carrier film disposed under at least a first adhesive layer or side (a second adhesive layer may be present on an opposite side of the carrier film for double-sided embodiments). In an embodiment, the adhesive is composed of a material, or materials, with an adhesive property that weakens (i.e., releases) upon exposure to UV light. In one such embodiment, the carrier film is composed of polyvinyl chloride and the one or two adhesive layers are acrylic-based adhesive layers.

Figure 4B:
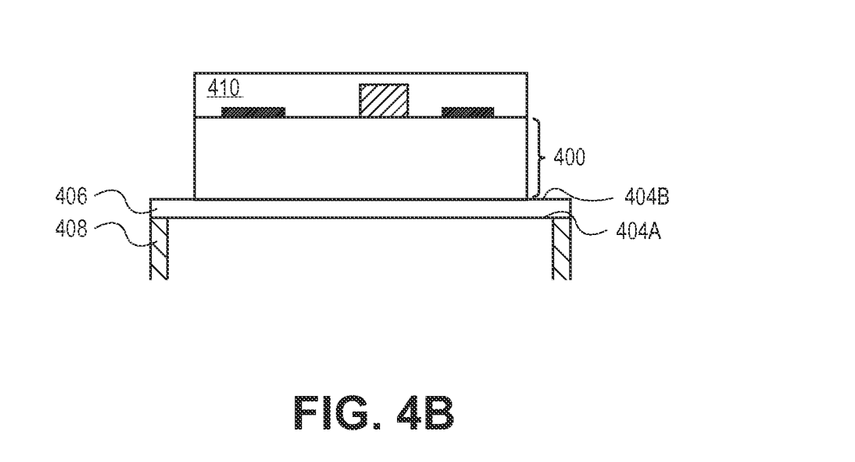

In one embodiment, as shown in FIG. 4B, coupling the wafer to the adhesive film entails contacting one adhesive layer 404A to the film frame 408. In the embodiment illustrated, the UV-cureable adhesive film is applied, for example with a conventional wafer tape applicator, first to the film frame 408 and then a second adhesive layer or side 404B is contacted to the semiconductor wafer 400 (FIG. 4B). Because the film frame 408 is larger than the wafer (e.g., ~380 mm for a 300 mm diameter wafer), the wafer 400 may be aligned to the taped film frame 408 before contacting the exposed adhesive. In an alternative embodiment, the UV-cureable adhesive film is applied, for example with a conventional wafer tape applicator, first to the semiconductor wafer 400, before contacting a second adhesive side to the film frame 408. For such embodiments, a first side of the double-side UV-curable tape is applied to the wafer backside (opposite front side 402), the taped wafer is then aligned with an untaped film frame and brought into contact with the film frame.

Figure 4C:
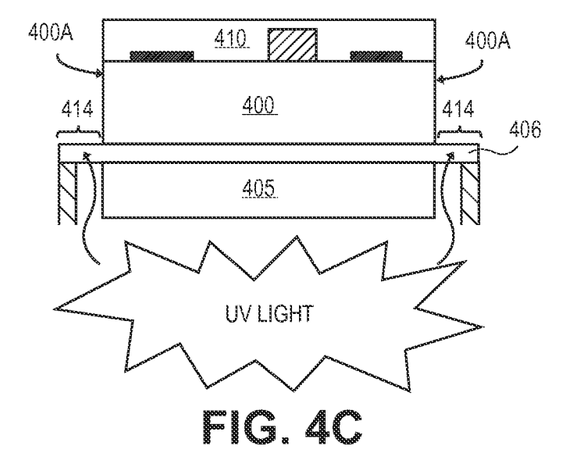

As shown in FIG. 4C, with the adhesive film 406 applied to a side of the film frame 408 by way of the adhesive layer 404A, the semiconductor wafer 400 is affixed to the other adhesive layer 404B with the mask 410 exposed. Although it is advantageous to apply the adhesive to the carrier substrate first where the semiconductor wafer 400 is very fragile, in alternate embodiments the double-sided adhesive film 406 (e.g., adhesive layer 404B) may also be applied to the wafer 400 first and then the other side of the adhesive film (e.g., adhesive layer 404A) applied to the film frame 408.

Returning to FIG. 1A, with the semiconductor wafer mounted onto the carrier, method 100 proceeds to operation 103 with the masked semiconductor wafer coupled to a film frame with UV-curable adhesive film. Similarly, method 140 (FIG. 1B) begins with operation 113, for example taking as an input starting material the assembly thus far prepared by method 100. Both the methods 100 and 140 then proceed with pre-curing of a peripheral portion of adhesive extending beyond the wafer edge on the same side of the carrier film as the wafer. In other words, the adhesive layer not contacted by the wafer and exposed on the wafer-side beyond the wafer edge is pre-cured. The pre-cure operations (103, 114) are to cross-link the adhesive material that will be exposed to the plasma during a subsequent plasma etch phase of the scribing process. Once cross-linked, the adhesive material becomes more etch resistant and less prone to spawning hydrocarbons subject to redeposition during the etch process. As such redeposition has been found to adversely affect etch performance, potentially contributing to one or more of: etch stop, chamber or wafer contamination, or loss of etch profile control, the pre-curing operation (e.g., 103 in FIG. 1A, 114 in FIG. 1B) has been found advantageous.

In one embodiment illustrated in FIG. 4C, the pre-cure operation entails exposing a top side adhesive to UV light originating from a back side of the adhesive film 406 and/or back side of the wafer 400. As such, at least some portion of the UV light transmits or passes through the carrier film of the adhesive film 406 before interacting with the top (front) side adhesive during the pre-curing. Although, in an alternate embodiment UV light originating from a front (top) side of the adhesive film 406 and/or front (top) side of the wafer 400 is utilized during the pre-curing operation, backside UV exposure has been found to be a cleaner process, minimizing the potential for particle adders and other contamination associated with front side processing. As further shown in FIG. 4C, the peripheral region 414 of the adhesive, beyond the perimeter wafer edge 400A, is irradiated while a mask 405 protects a center portion of the adhesive from being cured during the pre-cure. Generally, the mask 405 may be any contact or projection shadow mask capable of serving as a UV barrier to prevent curing of the adhesive disposed between the wafer 400 and the mask 405. In one embodiment, the mask 405 is approximately the same size as the wafer 400 and may be a dummy wafer, such as, but not limited to a silicon semiconductor wafer having a same diameter (e.g., 300 mm, 450 mm, etc.) as the wafer 400. The mask 405 is generally aligned with the wafer 400 during the pre-cure operation although some misregistration is acceptable as there is typically an edge bead exclusion on the wafer 400 which may lose adhesion after dicing as a result of the pre-etch partial cure without incurring die yield loss.

Figure 4D:
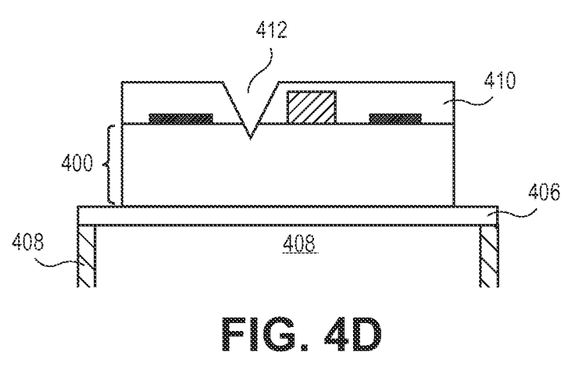

Following the pre-cure, the methods 100 and 140 proceed with laser scribe operations (104 and 115) and plasma etch operations (106 and 116). FIG. 2B provides a proximal cross-sectional view of the mask 202 being patterned with a laser scribing process to provide a patterned mask 208 with gaps 210, exposing regions of the semiconductor wafer or substrate 204 between the integrated circuits 206. FIG. 4D provides a distal cross-section view of the laser scribe process forming the gaps 412 while the wafer 400 is affixed to the film frame 408 by adhesive film 406.

Referring to FIG. 2B, the laser scribing process is generally to remove the material of the streets 207 present between the integrated circuits 206. In accordance with an embodiment of the present invention, patterning the mask 202 with the laser scribing process includes forming trenches 212 partially into the regions of the semiconductor wafer 204 between the integrated circuits 206. In an embodiment, patterning the mask 202 with the laser scribing process includes using a laser having a pulse width in the femtosecond range. Specifically, a laser with a wavelength in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Figure 3:
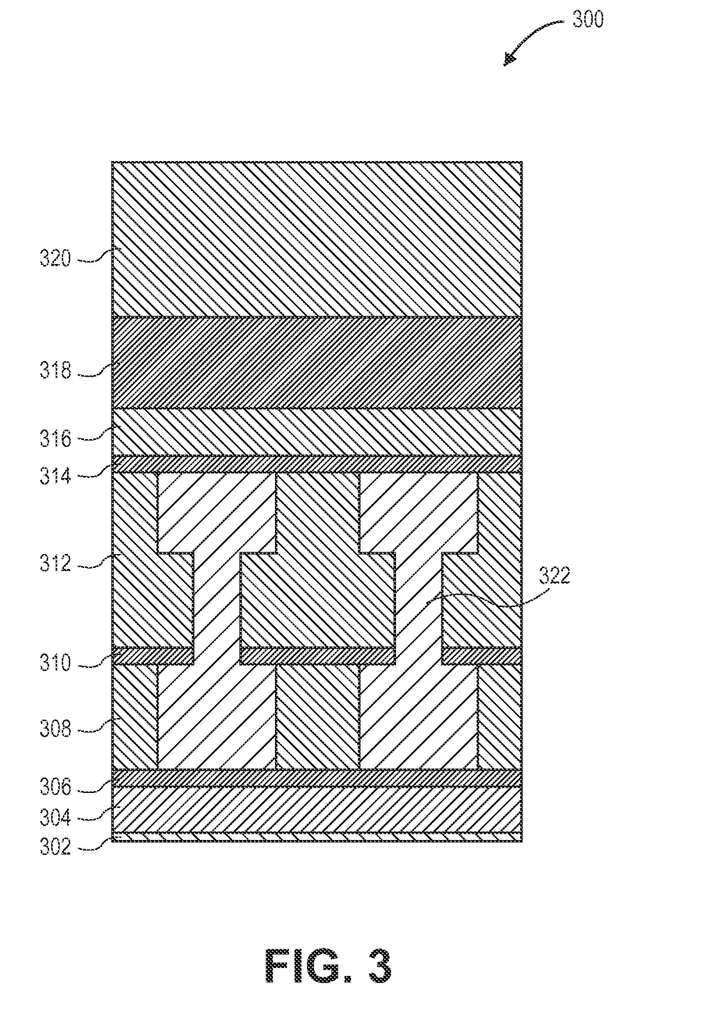
FIG. 3 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention. Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320, with relative thicknesses depicted. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 μJ to 100 μJ, although preferably approximately in the range of 1 μJ to 5 μJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Returning to FIGS. 1A and 1B, at the plasma etch operations (106, 116), the semiconductor wafer is plasma etched to singulate the ICs. The plasma etch front proceeds through the gaps 210 in the patterned mask 208 to form singulated integrated circuits 206. In accordance with an embodiment of the present invention, etching the semiconductor wafer includes etching the trenches formed with the laser scribing process to ultimately etch entirely through semiconductor wafer. This is illustrated both in FIG. 2C for the substrate 204 and in FIG. 4E for the wafer 400 (with formation of the through trench 416). In the exemplary embodiments illustrated by FIGS. 2C and 4E, the plasma etch is stopped on the adhesive film 214, 406, respectively with individualized portions 414 (e.g., 414A and 414B) of the semiconductor wafer 400 separated by trench 416.

Figure 4E:
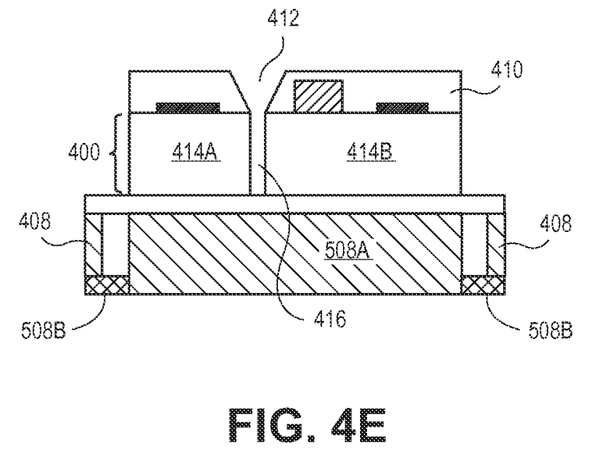
Figure 4F:
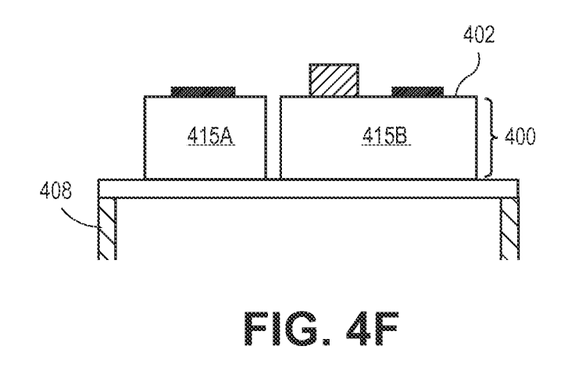

As illustrated in FIG. 4E, during the plasma etch process, the wafer 400 is disposed on a chuck 508A while attached to the film frame by the adhesive film. The film frame 408 being lager than the chuck 508A rests on an outer ring 508B surrounding the chuck 508A. In a specific embodiment, during the etch process the etch rate of the material of semiconductor wafer 400 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates (e.g., 40 μm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate.

Following the plasma etch operation (106 in FIG. 1A and 116 in FIG. 1B), the singulated integrated circuits remain coupled to the UV-curable adhesive film. Referring to FIG. 1A, at operation 108, and described in greater detail below in association with FIGS. 4F-4H, a center portion of the UV-curable adhesive film is cured with UV (light) energy irradiation to weaken the adhesive properties the of the UV-curable adhesive affixed to the wafer. In the exemplary embodiment illustrated by FIG. 4F, the patterned mask 410 of FIGS. 4A-4E is removed after the laser scribe and plasma etch portions of the singulation process and before removal of the adhesive film 406. This is also depicted by FIG. 2C. However, in alternate embodiments, the patterned mask 208 may be removed during, or following the second UV irradiation of the UV-curable adhesive film to which the center portion of the adhesive is exposed.

Figure 4G:
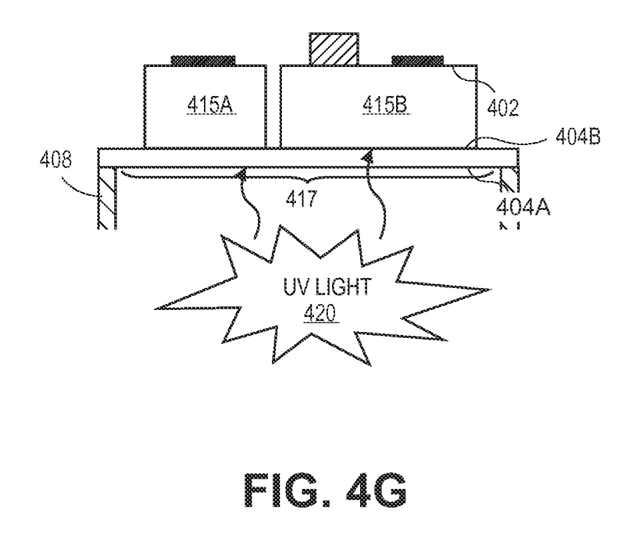

As illustrated by FIG. 4G, the UV-curable adhesive film is re-irradiated with UV light 420 through the film frame 408 in the absence of any mask (i.e., mask 405 of FIG. 4C has been removed). The UV light 420 is also transmitted through the carrier film of the UV-curable adhesive film in the center region 417 disposed below the wafer 400 to release the individualized ICs 415A, 415B from the adhesive tape. For example, as in operation 117 in method 140 (FIG. 1B), there is a complete cure of the adhesive side in contact with the wafer where curing a UV-release adhesive entails reducing an adhesiveness of one side of UV-curable adhesive film by at least 90%.

Figure 4H:
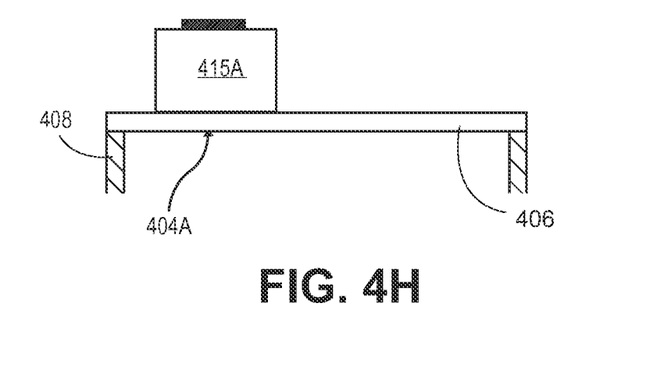

As further illustrated in FIG. 4H, with neither the pre-cure nor the secondary adhesive cure occurring from a top side of the wafer 400 (or frame 408) the adhesive film may be preferentially retained on the film frame when individualized ICs 415A, 415B are detached from the adhesive film and/or film frame 408. Notably, the operations 108 and 110 (or 117 and 121) may be performed at a package assembly house after a diced wafer is transported on the film frame from a IC fabrication facility, for example. The package assembly house may thereby utilize the film frame 408 much as they would any tape frame in a conventional pick and place packaging process. In one such embodiment, for example as illustrated by operation 121 in method 140 (FIG. 1B), detachment of die is on an individual die-basis with a conventional pick-n-place machine.

Alternatively, a protective layer, such as a conventional protective dicing tape may be applied to the side opposite the UV adhesive film 406, for example as would be done to a side of the semiconductor prior to dicing in conventional dicing tape/tape frame application. Once a front-side dicing tape was applied, the UV-curable adhesive film 406 may be partially cured to release the wafer side of the UV-curable adhesive film 406 as the front-side tape is expanded onto a tape frame. In such embodiments, the individualized die including ICs 415A and 415B are detached from the UV-curable adhesive film 406 at the wafer level.

Referring again to FIGS. 2A-2C, the plurality of integrated circuits 206 may be separated by streets 207 having a width of approximately 10 microns or smaller. The use of a femtosecond-based laser scribing approach, at least in part due to the tight profile control of the laser, may enable such compaction in a layout of integrated circuits. It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits. In an embodiment, the plurality of integrated circuits 206 may be arranged on semiconductor wafer or substrate 204 in a non-restricted or freeform layout.

A single process tool may be configured to perform many or all of the operations in a hybrid laser ablation and plasma etch singulation process including the use of a UV-curable adhesive film. For example, FIG. 5 illustrates a block diagram of a tool layout for laser and plasma dicing of wafers or substrates, in accordance with an embodiment of the present invention.

Figure 5:
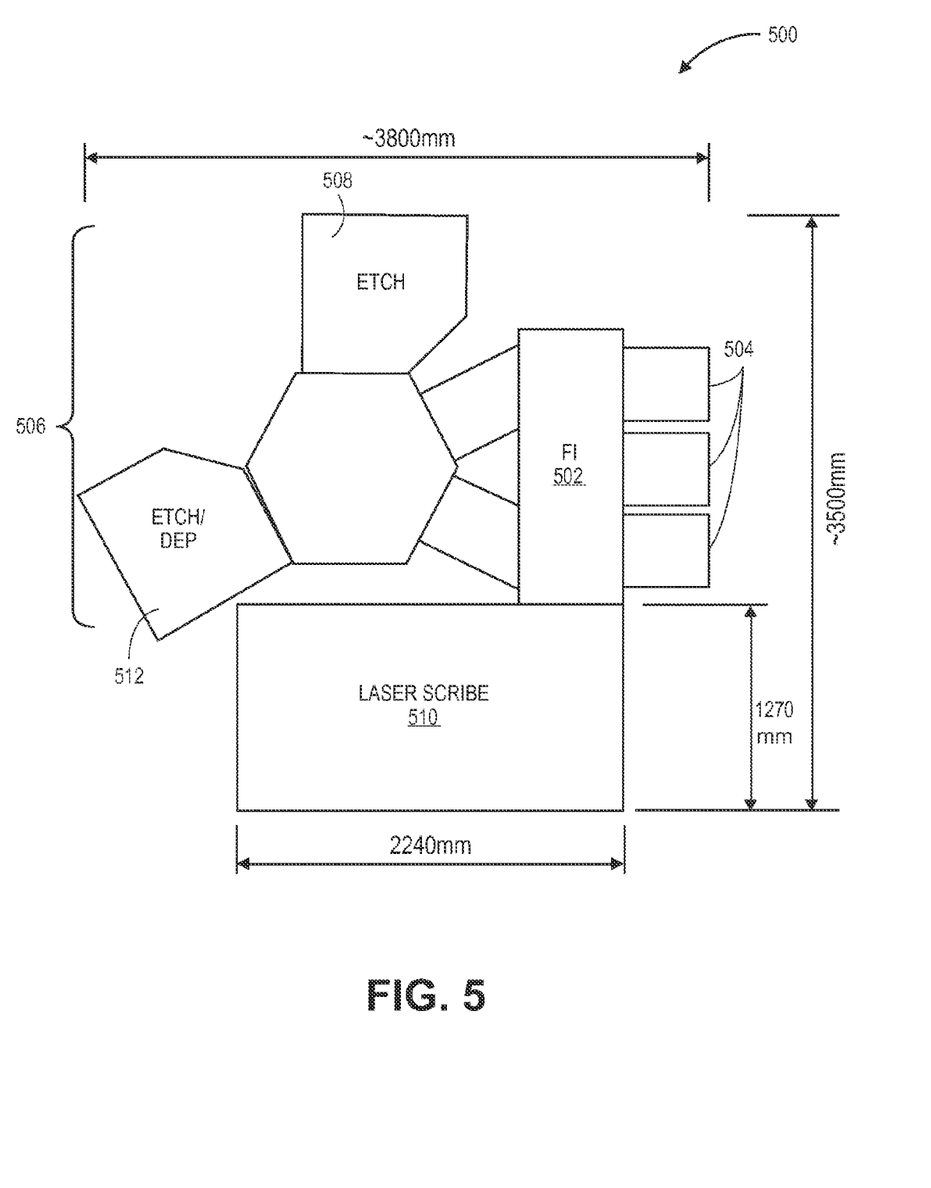
FIG. 5 illustrates a block diagram of a tool layout for laser and plasma dicing of wafers or substrates, in accordance with embodiments of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes a plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser. In one such embodiment, the laser is a femtosecond-based laser. The laser is suitable for performing a laser ablation portion of a hybrid laser and etch singulation process including the use of a mask, such as the laser ablation processes described above. In one embodiment, a moveable stage is also included in process tool 500, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2240 millimeters by approximately 1270 millimeters, as depicted in FIG. 5.

In an embodiment, the plasma etch chamber 508 is configured for etching a wafer or substrate through the gaps in a patterned mask to singulate a plurality of integrated circuits. In one such embodiment, the plasma etch chamber 508 is configured to perform a deep silicon etch process. In a specific embodiment, the plasma etch chamber 508 is an Applied Centura® Silvia™ Etch system, available from Applied Materials of Sunnyvale, Calif., USA. The plasma etch chamber 508 may be specifically designed for a deep silicon etch used to singulate integrated circuits housed on or in single crystalline silicon substrates or wafers. In an embodiment, a high-density plasma source is included in the plasma etch chamber 508 to facilitate high silicon etch rates. In an embodiment, more than one plasma etch chamber is included in the cluster tool 506 portion of process tool 500 to enable high manufacturing throughput of the singulation or dicing process.

In an embodiment, the plasma etch chamber 508 includes a chuck disposed within the chamber to clamp a wafer while disposed on a tape frame during a plasma process. The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, in place of an additional etch chamber, a deposition chamber 512 is included. The deposition chamber 512 may be configured for mask deposition on or above a device layer of a wafer or substrate prior to laser scribing of the wafer or substrate. In one such embodiment, the deposition chamber 512 is suitable for depositing a photoresist layer.

Figure 6:
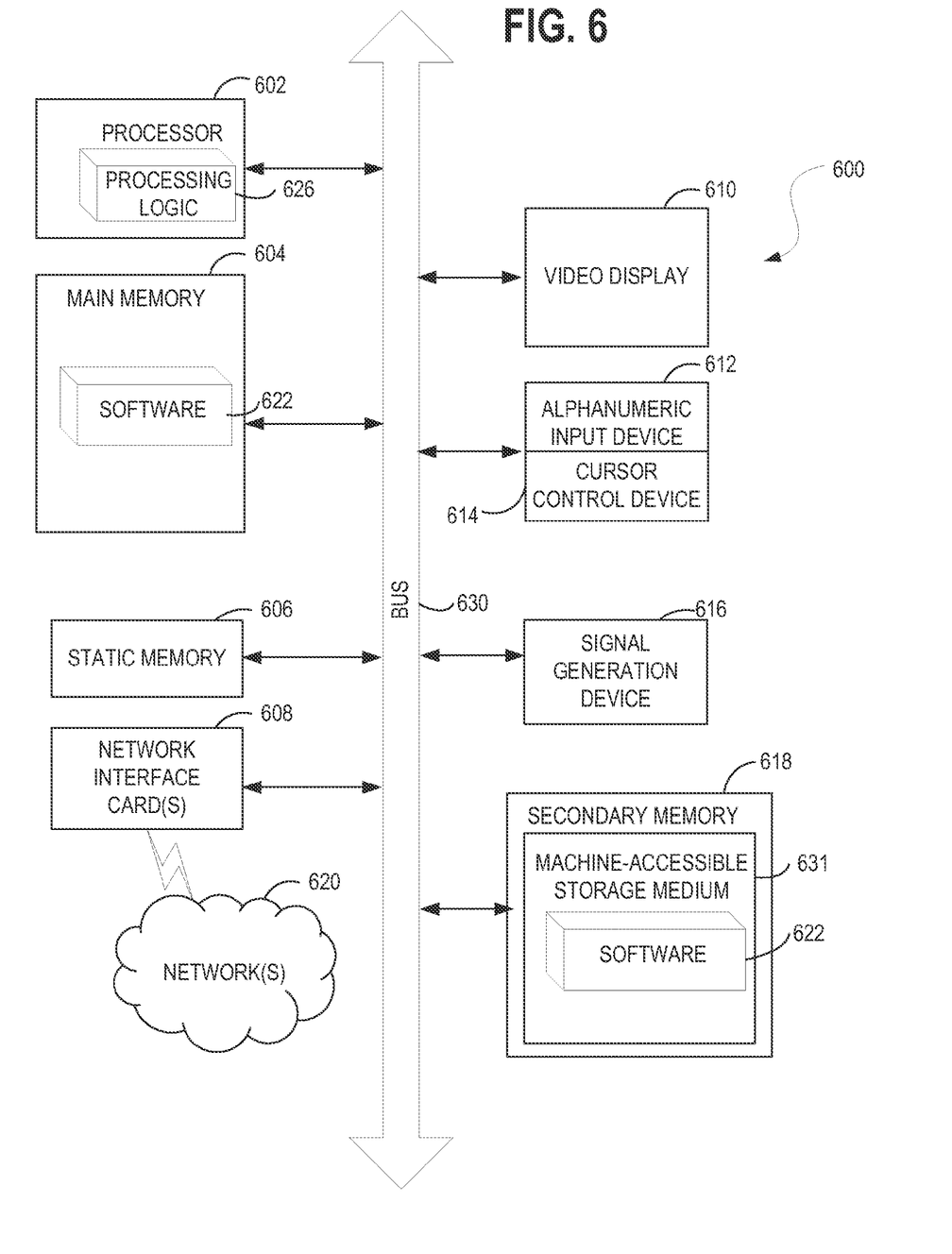
FIG. 6 illustrates a block diagram of an exemplary computer system within which a set of instructions, for causing the computer system to perform any one or more of the methodologies discussed herein, may be executed.

FIG. 6 illustrates a computer system 600 within which a set of instructions, for causing the machine to execute one or more of the scribing methods discussed herein may be executed. The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, etc. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention.

For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a semiconductor wafer comprising a plurality of integrated circuits, the method comprising:
    forming a mask above the semiconductor wafer, the mask covering and protecting the integrated circuits;
    coupling the semiconductor wafer to a film frame with an ultra-violet (UV)-curable adhesive film;
    pre-curing a peripheral portion of the adhesive film disposed beyond an edge of the semiconductor wafer, wherein the adhesive film is transmissive of UV light and wherein the pre-curing comprises:
        masking a center portion of the adhesive film to protect the center portion from UV exposure during the pre-curing of the peripheral portion; and
        irradiating the peripheral portion of the adhesive film with UV light originating from a backside of the adhesive film, at least some of the UV light passing through the adhesive film on which the peripheral portion of the adhesive film is disposed;
    patterning the mask with a laser scribing process to provide a patterned mask with gaps, exposing regions of the semiconductor wafer between the integrated circuits; and
    subsequent to pre-curing the peripheral portion of the adhesive film, etching the semiconductor wafer through the gaps in the patterned mask to form singulated integrated circuits while the semiconductor wafer is affixed to the adhesive film.

2. The method of claim 1, wherein masking the center portion further comprises disposing a UV barrier having a dimension approximately equal to that of the semiconductor wafer adjacent to the backside of the adhesive film in alignment with the semiconductor wafer.

3. The method of claim 2, wherein the UV barrier further comprises a dummy wafer of a same diameter as the semiconductor wafer.

4. The method of claim 3, wherein the semiconductor wafer and the dummy wafer are silicon, have a thickness approximately in a range of 100-600 µm, and are between 300 and 450 mm in diameter.

5. The method of claim 1, further comprising:
    curing a center portion of the adhesive film disposed within the edge of the semiconductor wafer by exposure to UV light; and
    detaching the singulated integrated circuits from the cured adhesive film.

6. The method of claim 1, wherein the UV-curable adhesive film comprises at least one acrylic-based adhesive disposed on a polyvinyl chloride film.

7. The method of claim 1, wherein coupling the semiconductor wafer to a film frame with an ultra-violet (UV)-curable adhesive film further comprises:
- contacting the adhesive film to the film frame;
- aligning the semiconductor wafer to the film frame; and
- contacting the semiconductor wafer to the adhesive film.

8. The method of claim 1, wherein patterning the mask with the laser scribing process comprises patterning with a femtosecond-based laser scribing process, and wherein etching the semiconductor wafer through the gaps in the patterned mask comprises using a high density plasma etching process.

9. The method of claim 7, wherein using a high density plasma etching process comprises:
- disposing the film frame on a support surrounding a chuck disposed in an etch process chamber;
- clamping the semiconductor wafer to the chuck;
- plasma etching the semiconductor wafer through the gaps in the patterned mask while disposed on the chuck; and
- unclamping the semiconductor wafer.

10. A method of dicing a plurality of integrated circuits, the method comprising:
- coupling a masked crystalline silicon substrate to a film frame with a UV-curable adhesive film, a mask covering and protecting integrated circuits disposed on the silicon substrate;
- pre-curing a peripheral portion of the adhesive film disposed beyond an edge of the silicon substrate, wherein the adhesive film is transmissive of UV light, and wherein the pre-curing comprises:
  - masking the center portion of the adhesive film to protect the center portion from UV exposure; and
  - irradiating the peripheral portion of the adhesive film with UV light originating from a backside of the adhesive film, at least some of the UV light passing through the adhesive film on which the peripheral portion of the adhesive film is disposed;
- patterning the mask, at least a layer of silicon dioxide, a layer of low K material, and a layer of copper with a laser scribing process to expose regions of the silicon substrate between the integrated circuits;
- subsequent to pre-curing the peripheral portion of the adhesive film, etching the silicon substrate through the exposed regions to form singulated integrated circuits;
- curing a center portion of the adhesive film disposed within the edge of the silicon substrate by exposure to UV light; and
- detaching the singulated integrated circuits from the cured adhesive film.

11. The method of claim 10, further comprising forming the mask above the silicon substrate before the silicon substrate is coupled to the film frame.

12. The method of claim 10, further comprising:
- re-irradiating the UV-curable adhesive film with UV light originating from the backside of the adhesive film, curing the center portion of the adhesive film disposed within the edge of the silicon substrate.

13. The method of claim 12, further comprising:
- subsequent to etching the silicon substrate and prior to re-irradiating the UV-curable adhesive film, removing the mask.

14. The method of claim 10, wherein patterning the mask, the layer of silicon dioxide, the layer of low K material, and the layer of copper with the laser scribing process comprises patterning with a femtosecond-based laser scribing process, and wherein etching the silicon substrate through the exposed regions comprises using a high density plasma etching process.

15. A system for dicing a semiconductor wafer comprising a plurality of integrated circuits (ICs), the system comprising:
- a deposition chamber to form a mask above the semiconductor wafer, the mask covering and protecting the ICs;
- an adhesive film applicator to couple the semiconductor wafer to a film frame with an ultra-violet (UV)-curable adhesive film;
- a curing station to pre-cure a peripheral portion of the adhesive film disposed beyond an edge of the semiconductor wafer, wherein the curing station is to further mask a center portion of the adhesive film to protect the center portion from UV exposure during the pre-curing of the peripheral portion;
- a laser scribe module to pattern the mask with a laser scribing process to provide a patterned mask with gaps, exposing regions of the semiconductor wafer between the integrated circuits; and
- a plasma etch chamber to etch the semiconductor wafer through the gaps in the patterned mask to form singulated integrated circuits while the semiconductor wafer is affixed to the adhesive film.

16. The system of claim 15, wherein the curing station is to irradiate the peripheral portion of the adhesive film with UV light originating from a backside of the adhesive film, at least some of the UV light passing through the adhesive film on which the peripheral portion of the adhesive film is disposed before etching the semiconductor wafer.

\* \* \* \* \*